US007718919B2

(12) United States Patent
Machado et al.

(10) Patent No.: US 7,718,919 B2
(45) Date of Patent: May 18, 2010

(54) INDUSTRIAL PLASMA REACTOR FOR PLASMA ASSISTED THERMAL DEBINDING OF POWDER INJECTION-MOLDED PARTS

(75) Inventors: Ricardo Machado, Caxias do Sul/RS (BR); Waldyr Ristow, Jr., Caxias do Sul/RS (BR); Aloisio Nelmo Klein, Florianópolis/SC (BR); Joel Louis Rene Muzart, Florianópolis/SC (BR); Marcio Celso Fredel, Florianópolis/SC (BR); Paulo Antonio Pereira Wendhausen, Florianópolis/SC (BR); Davi Fusão, Florianópolis/SC (BR); Paulo Roberto Alba, Caxias do Sul/RS (BR); Nilton Francisco Oliveira da Silva, São José/SC (BR); Luciano Antonio Mendes, Caxias do Sul/RS (BR)

(73) Assignee: Lupatech S.A., Caxias do Sul/RS, CEP (BR)

( * ) Notice: Subject to any disclaimer, the term of this patent is extended or adjusted under 35 U.S.C. 154(b) by 567 days.

(21) Appl. No.: 11/631,824

(22) PCT Filed: Jul. 14, 2005

(86) PCT No.: PCT/BR2005/000128

§ 371 (c)(1),
(2), (4) Date: Jan. 4, 2007

(87) PCT Pub. No.: WO2006/012718

PCT Pub. Date: Feb. 9, 2006

(65) Prior Publication Data

US 2007/0292556 A1 Dec. 20, 2007

(30) Foreign Application Priority Data

Aug. 6, 2004 (BR) .................................. 0403536-4

(51) Int. Cl.
*B23K 9/00* (2006.01)
*B23K 9/02* (2006.01)
(52) U.S. Cl. .............................. 219/121.43; 219/121.52
(58) Field of Classification Search ............. 219/76.16, 219/121.36, 121.43; 419/36; 373/29, 41, 373/60, 62, 112
See application file for complete search history.

(56) References Cited

U.S. PATENT DOCUMENTS

| 4,381,965 | A | * | 5/1983 | Maher et al. | ........... 219/121.43 |
| 4,630,280 | A | * | 12/1986 | Gunthner | ...................... 373/41 |
| 6,579,493 | B1 | | 6/2003 | Klein et al. | |
| 2007/0045246 | A1 | * | 3/2007 | Fujioka et al. | ......... 219/121.52 |

FOREIGN PATENT DOCUMENTS

| WO | WO 9000308 A1 * | 1/1990 |
| WO | WO 02/00569 | 1/2002 |

OTHER PUBLICATIONS

Maria Antonia Dos Santos, Matheus Pizzalunga Neivock, Ana Maria Maliska, Aloisio Nelmo Klein, Joel Louis Rene Muzart, Plasma Debinding and Pre-Sintering of Injected Parts, Materials Research, vol. 7, No. 3,505-511, 2004, Florianopolis-SC, Brazil.

* cited by examiner

*Primary Examiner*—Quang T Van
*Assistant Examiner*—Hung Nguyen
(74) *Attorney, Agent, or Firm*—Hedman & Costigan, P.C.

(57) ABSTRACT

Industrial plasma reactor for plasma assisted thermal debinding of power injection-molded parts is a reactor used for the plasma assisted debinding and sintering of metallic or ceramic parts produced by the powder injection molding process, comprising a vacuum chamber (1) containing a cathode-anode (7,8) system for plasma generation and a resistive heating system (6) in the same vacuum chamber (1) ambient.

10 Claims, 4 Drawing Sheets

INDUSTRIAL PLASMA REACTOR FOR PLASMA ASSISTED THERMAL DEBINDING OF POWDER INJECTION-MOLDED PARTS

Describes the constructive configuration of industrial reactor for thermal debinding, assisted by plasma, of parts produced by powder injection molding.

The powder compacting techniques are appropriate for manufacturing of near net shape parts with tight dimensional tolerances which are economically competitive for the serial production of finished parts on iron, steel and other metallic alloys, as well as ceramics and particulate composites.

Among the powder forming techniques, the double action pressing with moving die and the powder injection molding (PIM) are the most important for the manufacturing of engineering components with high dimensional precision and quality.

The powder injection molding technique overcomes the limitations of the double action pressing of parts with complex geometrical shapes. The process consists basically of mixing powders with a binder system to obtain a homogeneous feedstock with reological properties appropriate for injection, heat-up the paste to temperatures in which it is in a liquid state and inject it into a die with the desired geometry. The binder cools down inside the die, becoming solid, and reaching the needed green mechanical strength. After cooling, the injected green parts are removed from the die.

In sequence, the binder removal and the sintering are performed. Among the most used materials in powder injection molding process are the oxides, nitrides, carbides, steels, refractory metals, intermetalic compounds and particulate composites. The main applications of injected products (metallic, ceramic and composites) are dental implants and prostheses, injection nozzles, surgical and odontological instruments, machine and equipment components, printed circuits, machining tools, computer accessories, porous components, turbine rotors, i.e., applications where complex geometries and a high material quality are simultaneously required.

The powder injection molding is done in conditions basically similar to polymer injection and after injection it is necessary to proceed debinding and sintering. The furnace/reactor for debinding is the object of this report supporting the patent application. The debinding is presently done by different routes such as supercritical extraction, which is rarely used and is still not adequately developed, a combination of solvent and thermal debinding and, depending on the binder system used, a thermal debinding only. A different binder system developed by BASF® from Germany uses a catalytic process followed by thermal debinding of the remaining binder. Therefore, the choice of the binder extraction process depends on the binder system used. The most commonly used binder systems for metal powder injection molding (MIM) are composed of a base polymer, such as polyethylene and polypropylene, and low molecular weight additives such as paraffin, ethylene-vinyl-acetate, stearic acid and waxes. After injection, the debinding must be performed carefully to avoid the formation of defects. Also, the thermal debinding techniques currently used leave organic residues deposited onto the furnace surfaces and vacuum pumping system, when it is performed under vacuum; moreover, they demand a relatively long debinding time in order to avoid the formation of defects, increasing the overall costs, and they produce gas pollutants, since they release hydrocarbons and also carbon monoxide, when there is combustion in the presence of oxygen.

The plasma assisted debinding process, described in the BR PI 9901512-9, EP 1230056 and U.S. Pat. No. 6,579,493 patents avoids the formation of organic residues in the furnace and vacuum pumping system and there is a total reduction of debinding time over 80% when compared to traditional thermal debinding processes. The process uses the reactivity of the ambient characteristic of the plasma (abnormal electrical glow discharge) created by a direct current electrical discharge generated between an anode and a cathode placed in a low-pressure gas (0.1 to 15 Torr). The furnace/reactor to perform the binders removal, described and claimed in this report, has constructive characteristics that make viable the binder removal process described in those patents. The process concerns the use of electron energy generated in the electric discharge. The electron's energy is transferred to the organic macromolecules by inelastic collision causing their dissociation into smaller $C_xH_y$ organic radicals. Atomic hydrogen is also generated within the plasma and it reacts chemically with the radicals preventing their recombination into longer molecules. The molecules originated from the dissociation have smaller molecular weight and exist in the gas state under atmospheric conditions, being removed with the gas outflow from the reactor promoted by the vacuum pump.

The success of the process and upscale to industrial conditions requires an adequate design of the anode-cathode configuration. The present patent application claims list comprises this whole physical cathode-anode set configuration. A large number of electrons must be generated near the parts to promote the dissociation of all organic molecules. The generation of energetically excited atoms and molecules around the parts is also important, for the chemical reaction with the debinding products preventing the deposition of organic residues. Another aspect of critical importance is related to the possible warping of the electrodes (anode and cathode) as a result of the elevated temperature, reaching 1300° C. during sintering, that they are subjected to. When warping occurs, the electrical discharge becomes unstable, resulting in the formation of micro electric arcs and this totally prevents the use of the equipment in industrial settings. Constructive details of the cathode-anode arrangement are claimed in this patent application.

SHORT DESCRIPTION OF THE INVENTION

This report describes the development of equipment suited for the plasma assisted thermal debinding of parts produced by powder injection molding. When convenient or necessary, both debinding and sintering steps can be performed in the same equipment and thermal cycle. The equipment described has in the same reactor chamber, the electrode system in the form of confined anode-cathode geometry, to generate the plasma, and an auxiliary electrical resistive heating system suited to safely raise the reactor temperature above 1100° C., which is the typical sintering temperature range of injected parts. Since the voltage applied to the resistive heating elements is low (10 to 60 V), there is no interference from the resistive heating system in the electrical discharge generated between the anode and the cathode.

In a plasma reactor, heat is generated as a result of the ions and neutral particles colliding against the cathode. When the electrical discharge is the only source of heat generation, the temperature obtained is a function of the plasma electrical parameters, i.e., the voltage applied, the gas pressure (or gas mixture pressure), the current density, and other plasma set up parameters. Thus, high power plasma is needed to reach the pre-sintering and sintering temperatures, usually higher than that needed to promote the debinding of injected parts and also thermo-chemical surface treatments, such as plasma nitriding. To correctly perform the plasma assisted extraction of organic binders followed by pre-sintering and sintering, in addition to the anode-cathode system, a resistive heating system is used as the main source of heat. This allows the adjustment of the plasma parameters to better degrade the organic binder and promote the physical-chemistry gas phase reactions.

The equipment described here allows the industrial scale removal of organic binders and sintering of parts produced by powder injection molding, in a single thermal cycle, using an electrical discharge in hydrogen or in hydrogen containing gas mixtures. The claims presented in this patent application, contain a description of the geometrical shape and arrangement of the elements that form the reactor in the exact way that allows for the plasma assisted removal of binders described in patents BR PI9901512-9, EP 1230056 and U.S. Pat. No. 6,579,493.

FIG. 1 presents a rendering of the reactor, comprising a vacuum chamber(1) with gas inlet(2) or gas mixture and outlet(4) for the vacuum system, pressure measurement system(3), electrical energy connections for cathodes(7) and anodes(8), being the anodes the support for the plates or trays(13) that contain the parts(9) and an auxiliary resistive heating system formed by resistors(6).

FIG. 2 presents an illustrative example of the arrangement of the parts(9) on trays(13).

FIG. 3 presents details of the anode(8) assembly, which has the shape of a truss cage with shelves(81) fixed at the edges (82) of the cage. The shelves are arranged as successive horizontal, parallel layers.

FIG. 4 presents the trays(13), containing the parts(9), positioned on top of the shelves(81) of the anode(8) set.

FIG. 5 presents details of the cathode(7) assembly which has the shape of a truss cage formed by transversal bars(72) fixed to vertical poles(71) being the transversal bars(72) rendered fixed by linking bars(73) which rigidly link their ends. The transversal bars(72) have cylindrical grooves(75) along their length for positioning the removable bars(74). Each pair of transversal bars(72) is fixed to a pair of linking bars(73), forming a rigid square structure. These squares are then arranged vertically as a succession of horizontal parallel layers.

Figure 7:
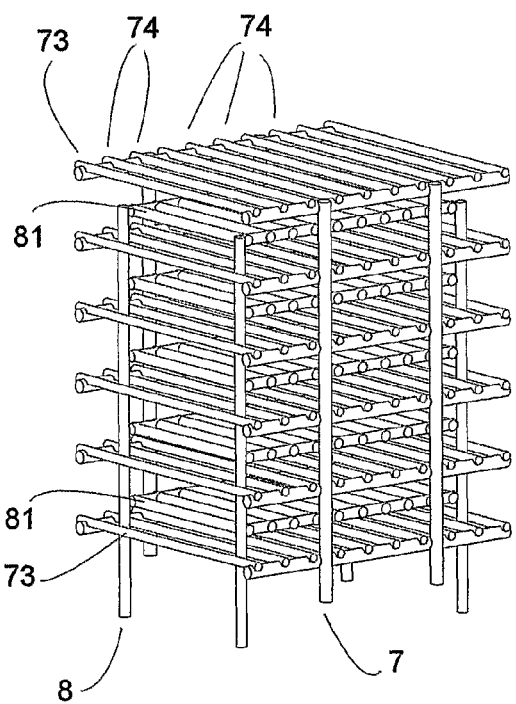
FIG. 7 shows the cathode(7) and the anode(8) inserted into one another so that a set of removable bars(74) stays between shelves(81) in layers parallel to the horizontal layers formed by shelves(81).
Figure 8:
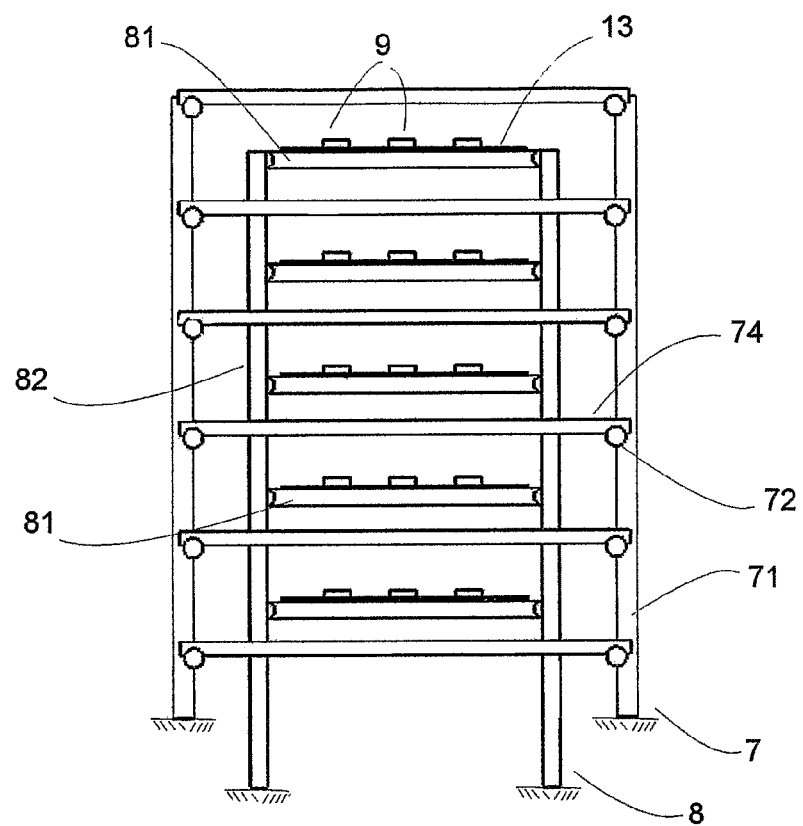

FIG. 8 presents a lateral view of the cathode(7) and anode (8) assemblies, as shown in FIG. 7, but now with the trays(13) filled with the parts(9) placed on top of the shelves(81).

Figure 9:
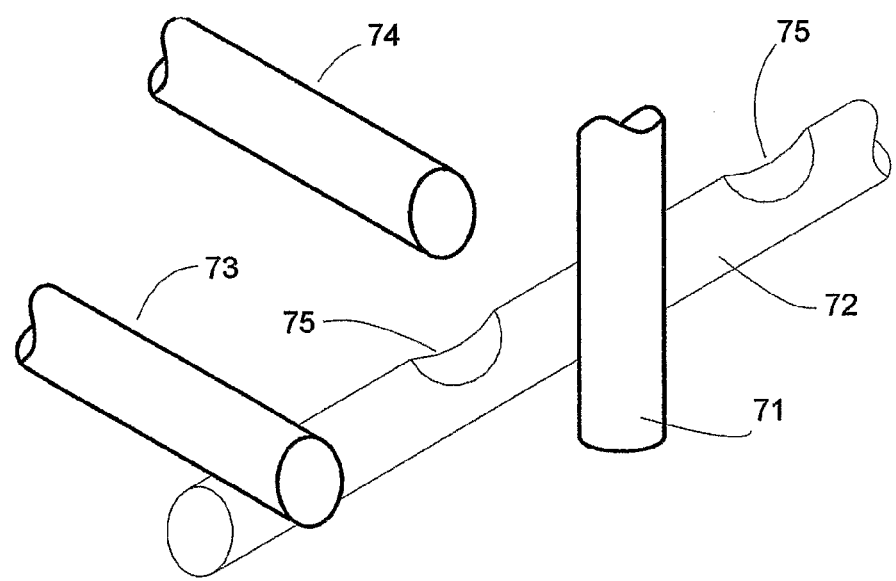

FIG. 9 shows details of the cathode(7), with emphasis on the removal of removable bars(74). The removable bars(74) are removed during the anode(8)-cathode(7) assembling.

DESCRIPTION OF THE INVENTION

Figure 1:
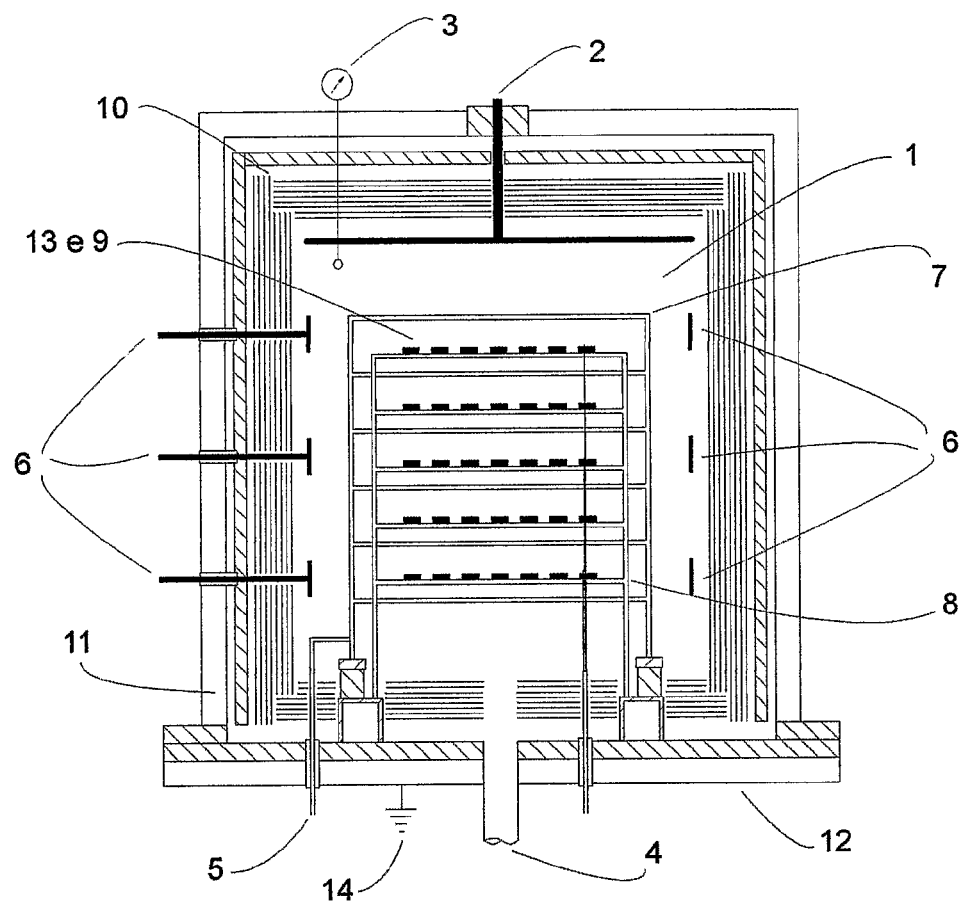
Figure 2:
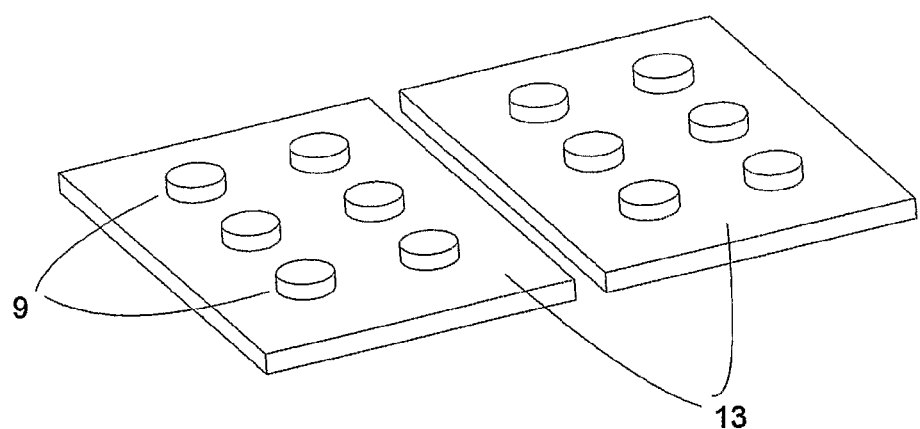
Figure 3:
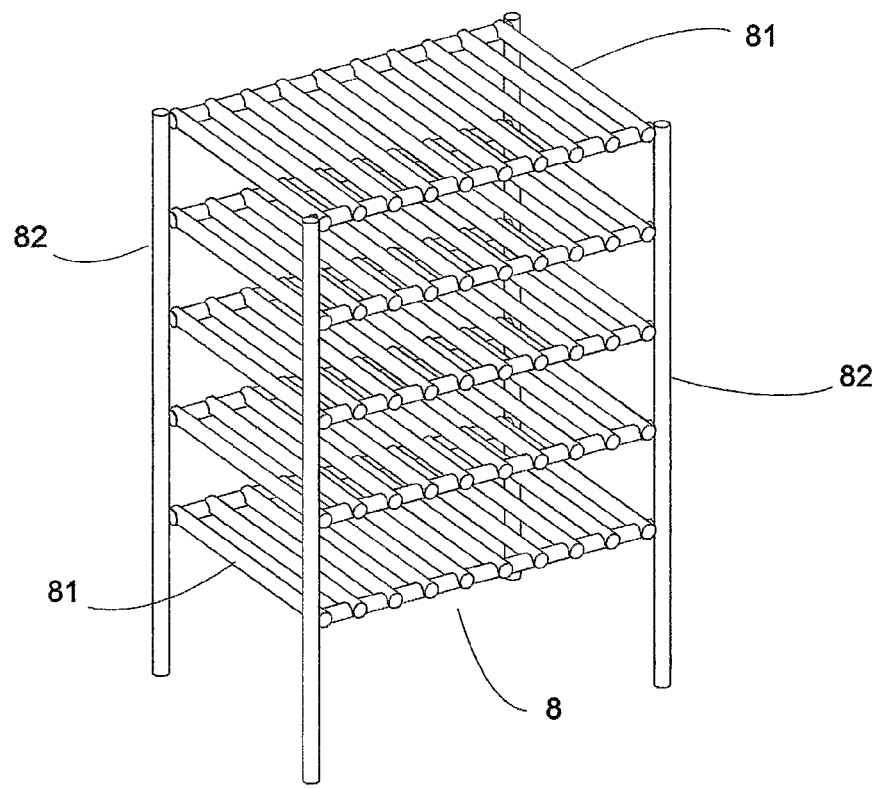

The equipment rendered in FIG. 1, comprising a vacuum chamber(1) surrounded by a double wall case(11) with a water-cooling jacket. Near the vacuum chamber(1) inner walls there is a set of metallic shields(10) for insulation of vacuum chamber(1) reducing the heat loss of the radiation heat flux generated by the plasma and the resistive heating system(6). There is a gas or gas mixture outlet(4) to connect the vacuum pump to said vacuum chamber(1) and a gas or gas mixture inlet(2), to keep the internal ambient at the required gas or gas species concentration appropriate for the plasma discharge that is established between the anode and the cathode. There is an electric power supply(5) to feed the plasma electrodes. The resistive heating system has the purpose of regulating and stabilizing the vacuum chamber(1) temperatures when it operates at lower temperatures and of providing the required thermal energy to reach the higher process temperatures (500° C. to 1400° C.).

The electrode subset, composed of anodes(8) and cathodes (7), is placed inside the vacuum chamber(1). The anodes(8) also support the trays(13) that hold the parts(9). The subset cathode-anode(7 and 8) is manufactured with a refractory metal alloy. Both the cathode(7) and the anode(8) are made with structural elements with cylindrical, rectangular or other cross-sections, which are joined by welding, screws or any other mechanical linkage, so as to form a rigid structure.

Figure 4:
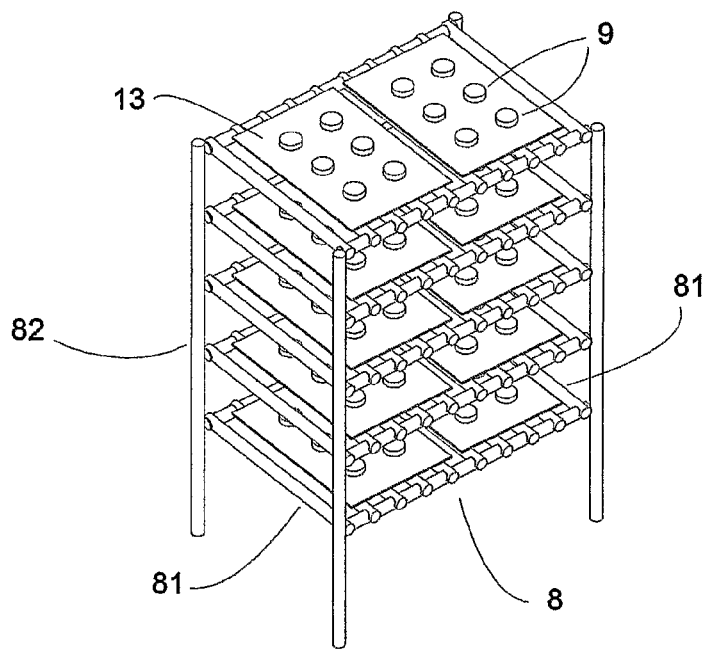

The trays(13) are placed on anodes(8) on top of shelves (81), which are arranged in many levels, as shown in FIG. 4. When the parts(9) are placed on top of trays(81) made of ceramic plates, they remain in floating potential. When they are in electrical contact with the anode(8), which is grounded, they are in a zero potential, while the cathode is connected to the negative terminal of the power source. In both configurations, there is an intense electron bombardment on the surface of the parts(9), allowing the activated degradation of the organic binder. Also, since the luminous zone of the plasma discharge surrounds the parts(9), the reactive species generated by the plasma discharge chemically react with the degradation products with a high degree of conversion. In this way, the products of the degradation of the organic binder are converted to low molecular weight gases, such as methane, which are in turn removed by the vacuum pump, keeping the vacuum chamber(1) clean of deposits.

Figure 5:
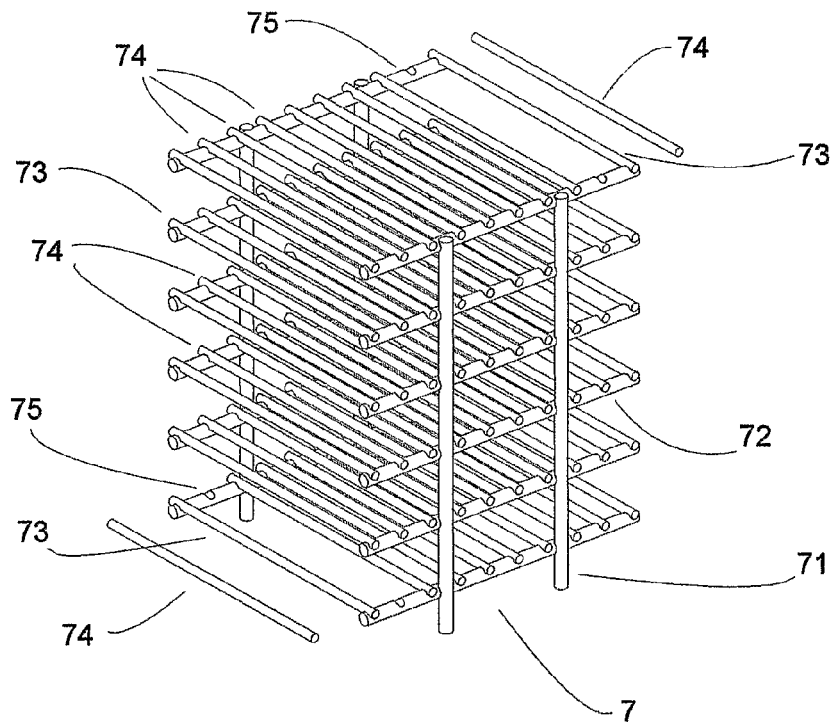
Figure 6:
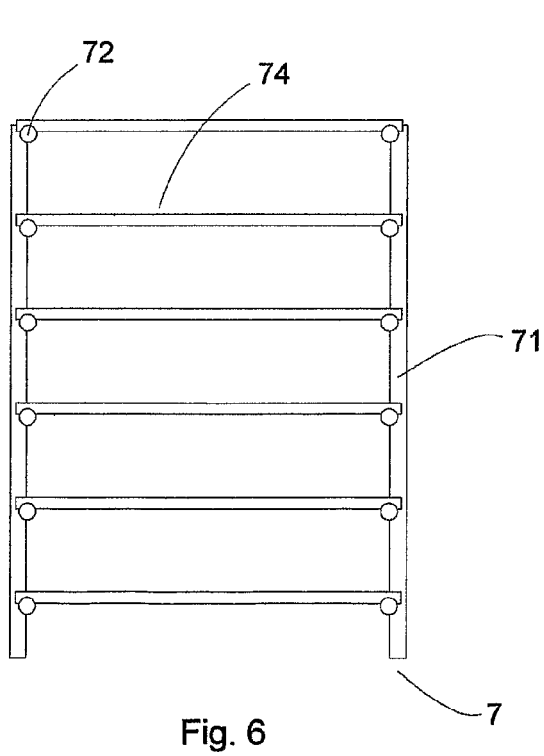
FIG. 6 is a frontal view of cathode(7), as showed in FIG. 5, which structurally has the shape of a truss cage having vertical poles(71) with transversal bars(72) fixed to the vertical poles(71) and with linking bars(73) rigidly joining the ends of transversal bars(72)

The cathode(7) is assembled in the form of a rigid cage in which the rectangular horizontal planes, formed by transversal bars(72) and linking bars(73), are arranged in successive parallel layers, as shown in FIG. 5. This cathode (7) structure is intertwined with the anode(8) structure, as shown in FIGS. 6 to 8. After the cathode(7) is assembled around the anode(8), the removable bars(74) are placed on grooves(75) existent on transversal bars(72) exactly over and under trays(13) involving each shelf(81), so as to generate plasma around the parts (9) under treatment. These cathode's removable bars(74) are separated horizontally by 3 mm to 50 mm, according to the required cathode's area. The removable bars(74) are simply placed on machined grooves(75) on transversal bars(72), in a way that they can be removed when needed, as shown in FIGS. 5 and 9.

The electrodes are made of molybdenum or molybdenum alloys or another material with a good electrical conductivity able to resist, with little warping, the temperatures needed for pre-sintering and sintering of metal and ceramic parts. With this configuration and using molybdenum or molybdenum alloys, warping is minimized, thus avoiding instabilities in the electrical discharges. This is of fundamental importance for the up scaling of the concept for industrial application.

The plasma technology is presently being used for nitriding, carbonitriding, cementation, oxidation, debinding, sintering, and other processes. The equipment hereby described is suited to the plasma assisted debinding, with the possibility to perform both the debinding and the sintering in a single thermal cycle, and for the plasma assisted surface treatment, such as nitriding, cementation and carbonitriding.

The invention claimed is:

1. An industrial plasma reactor for plasma assisted thermal debinding of powder injection-molded parts comprising a vacuum chamber (1) which encloses an anode/cathode system for plasma generation, the anode/cathode system comprises:

an anode (8) system in a shape of a parallelepiped truss cage formed by parallel horizontal shelves (81) fixed to vertical poles (82); and a cathode (7) system in a shape of a parallelepiped truss cage interposed within the anode (8) system wherein the cathode (7) system parallelepiped truss cage is formed by vertical poles (71) with transversal bars (72) fixed to said vertical poles (71) having horizontal bars (73) linking rigidly to the ends of said transversal bars (72) and the transversal bars (72) having a number of transversal grooves spaced along their lengths.

2. The industrial plasma reactor for plasma assisted thermal debinding of powder injection-molded parts according to claim 1, characterized by having the horizontal parallel shelves (81) vertically spaced in distances ranging from 3 mm to 200 mm.

3. The industrial plasma reactor for plasma assisted thermal debinding of powder injection-molded parts according to claim 1, wherein the cathode (7) system further comprises removable bars (74) that removably link the transversal bars (72) and are interspersed within the horizontal parallel shelves (81) of the anode (8) system.

4. The industrial plasma reactor for plasma assisted thermal debinding of powder injection-molded parts according to claim 3, characterized by having the removable bars (74) of cathode (7) system parallel and horizontally spaced in distances ranging from 3 mm to 50 mm.

5. The industrial plasma reactor for plasma assisted thermal debinding of powder injection-molded parts according to claim 2 wherein the cathode (7) system further comprises removable bars (74) removably linking the transversal bars (72) and are interspersed within the parallel shelves (81) of the anode (8) system.

6. The industrial plasma reactor for plasma assisted thermal debinding of powder injection-molded parts according to claim 5, characterized by having the removable bars (74) of cathode (7) system parallel and horizontally spaced in distances ranging from 3 mm to 50 mm.

7. The industrial plasma reactor for plasma assisted debinding of powder injection-molded parts according to claim 1 further comprising a resistive heating system.

8. The industrial plasma reactor for plasma assisted debinding of powder injection-molded parts according to claim 2 further comprising a resistive heating system.

9. The industrial plasma reactor for plasma assisted debinding of powder injection-molded parts according to claim 3 further comprising a resistive heating system.

10. The industrial plasma reactor for plasma assisted debinding of powder injection-molded parts according to claim 4 further comprising a resistive heating system.

\* \* \* \* \*